(12) United States Patent
Marion

(10) Patent No.: US 6,281,039 B1
(45) Date of Patent: Aug. 28, 2001

(54) HYBRID DEVICE AND A METHOD OF PRODUCING ELECTRICALLY ACTIVE COMPONENTS BY AN ASSEMBLY OPERATION

(75) Inventor: François Marion, Saint Egreve (FR)

(73) Assignee: Commissariat a l'Energie Atomique, Paris (FR)

(*) Notice: Subject to any disclaimer, the term of this patent is extended or adjusted under 35 U.S.C. 154(b) by 0 days.

(21) Appl. No.: 09/394,050

(22) Filed: Sep. 13, 1999

(30) Foreign Application Priority Data

Sep. 28, 1998 (FR) .................................................. 9812072

(51) Int. Cl.[7] ........................... H01L 21/44; H01L 21/48; H01L 21/50
(52) U.S. Cl. ............................................ 438/106; 438/108
(58) Field of Search ...................................... 438/106, 108

(56) References Cited

U.S. PATENT DOCUMENTS 5,536,680   7/1996   Ehmke .
6,025,618 * 2/2000   Chen .
6,110,760 * 8/2000   Medlen et al. .

FOREIGN PATENT DOCUMENTS 2 715 002    7/1995   (FR) .

OTHER PUBLICATIONS

Patent Abstracts of Japan, vol. 011, No. 182 (E–515), Jun. 11, 1987, JP 62 013085, Jan. 21, 1987.

* cited by examiner

Primary Examiner—John F. Niebling
Assistant Examiner—Josetta I. Jones
(74) Attorney, Agent, or Firm—Oblon, Spivak, McClelland, Maier & Neustadt, P.C.

(57) ABSTRACT

The invention relates to a method of assembling first and second electronic components (2, 4), the first of the components being fitted with conductive connection contacts (42), the method comprising
   a step of assembling the two components,
   the creation of at least one electrically active zone (40) in the second component, by diffusion of the material of the connection contacts from the first component into the second component.

20 Claims, 4 Drawing Sheets

HYBRID DEVICE AND A METHOD OF PRODUCING ELECTRICALLY ACTIVE COMPONENTS BY AN ASSEMBLY OPERATION

TECHNOLOGICAL FIELD AND PRIOR ART

This invention relates to the field of electronics and to the field of assembling two electronic components coming from different sources (different substrates).

It also relates to the generation of electrically active functions (of the diode type, for example) by an assembly operation.

Possible examples of applications are those of infra-red wave detectors, but other types of components can be constructed by this technique (for example: detectors in the visible range, electroluminescent diodes, etc.).

Two families of hybrid opto-electronic devices involving the transfer of epitaxial layers are currently being studied, using two assembly techniques:

the Epitaxial Lift-Off(ELO) technique, the hybridization by bead (FLIP-CHIP) technique.

French patent FR-2 715 002 shows how an adapted FLIP-CHIP technique allows one to transfer and interconnect epitaxiated layers onto a silicon reading circuit.

These techniques are aimed at carrying out the assembly of epitaxiated layers with a silicon circuit. For example, one technology is produced on a slice of silicon while one technology is produced on a slice of another material, for example AsGa.

The epitaxy produced on the AsGa substrate is transferred onto the silicon substrate. The inter-connection of these two components is provided by bringing into contact metal coatings created on each of the components;

In the case of the ELO technology, this electrical interconnection is provided by an extra technological operation after the Si assembly operation. In FIG. 1, a reading circuit 2 made of silicon supports a thin epitaxiated layer 4, made of another material. Reference numbers 6, 10 designate the metal contacts. The contact pick-up 8 is made through the upper face of the epitaxy.

In FIG. 2, the electrical connection is provided by metal contacts 12, 14. In other words, this connection is provided by a contact and a metal-metal annealing operation on the surfaces facing one another, a-if the contact pick-up is through the surface facing the silicon circuit.

In the case of FLIP-CHIP technology, inter-connection is provided by beads 20 of the tin-lead or indium type that connect the metal contacts 22, 24 (FIG. 3).

In all cases, the components must be assembled with extreme precision in such a way that the technologies on the components to be joined coincide with the technologies present on the receiving components. In particular, as illustrated in FIG. 4, the spacings dx, dy (in two directions) between two metal contacts 28, 30, must be less than 5 μm, or better.

The U.S. Pat. No. 5,536,680 proposes the production of an infra-red detector by creating diodes at the moment of assembly: This technology is called SAB or Soft Aligned Bonding.

An epitaxiated layer is placed facing a silicon circuit 2 covered with adhesive 32 and fitted with micro-points 34 (FIG. 5). A pressure is exerted between the two circuits 2, 4 and the micro-points create a zone N in the material P opposite.

As already mentioned above, the two technologies ELO and FLIP-CHIP require the components to be perfectly aligned during assembly. The specifications generally required are accuracies better than +/−5 μm and can even reach +/−1 μm. This assembly operation necessitates expensive equipment.

SAB technology is a self-aligning technique.

The two technologies ELO and FLIP-CHIP require the carrying out of technologies on both components to be assembled, which are specific to the assembly operation:

Production of contact metal coatings on both sides, in all cases (see FIGS. 1, 2, 4)

Production of a technology, after the assembly operation in the case of ELO technology (FIG. 1).

Production of a technology of solder beads in the case of FLIP-CHIP technology.

SAB technology does not require any detector side technology. It requires a technology on the reading circuit side (micro-points).

Finally, the two technologies do not easily allow the production of components of large size or of a small pitch.

ELO technology requires the handling of layers of a few micrometers thickness which are therefore stretchable. It is impossible therefore to guarantee an alignment better than a micrometer over a length of several centimeters.

FLIP-CHIP technology requires the production, for example, of bead technology within a pitch of 10 μm or less, which implies variations in flatness of the components facing one another which are extremely low.

On the other hand, for a given pitch and a given number of points, differences in the expansion coefficients of the components to be assembled mean that it is impossible to have components face to face at the hybridization temperature: the contact areas cross at the hybridization temperature and are no longer facing one another for the soldering.

As an example one may take the production of an infrared detector of 2000×2000 points with a pitch of 20 μm. This leads to components of a size 40×40 mm over the photodetection area.

Over such a size, the hybridization techniques mean that thermal expansion between detection circuits (for example a CdTe substrate) and reading circuits (for example made of silicon), at the end of a diagonal, is greater than 18 μm at the hybridization temperature, which forbids the use of this technique for the assembly.

Similarly, it is impossible to align a thin stretchable layer with sufficient precision on components of this size (ELO technology).

As for SAB technology, it enables the problems of alignment and large size to be resolved but there are other disadvantages as follows:

The micro-points must all have the same simultaneous pressure for the creation of diodes. This implies extreme flatness for the components and complex fittings for parallelism during application of the pressure.

This technique is only suitable for materials where an area of stress leads to the creation of a zone of opposite type to that where it is exerted (N on P or P on N).

This is true for compounds of the CdHgTe (CMT) type but it is not true for all the materials where a zone of stress does not generally correspond to the creation of a diode.

In the case of CdHgTe, with this technique, it is known not to use a P type ohmic contact, the micro-point automatically creating an N type zone.

DESCRIPTION OF THE INVENTION

The subject of the invention is a method of assembling first and second electronic components, the first of the components being fitted with conductive connection contacts comprising at least one material capable of diffusing into the second component, the method comprising:

a step of assembling two components, and the production of at least one electrically active zone in the second component, by diffusion of said material for connection contacts from the first component to the second component.

The technique according to the invention allows one:

to avoid the carrying out of an extra diffusion or implantation operation into the second component, to avoid any problem of alignment during assembly of the components, to avoid the flatness constraints (FLIP-CHIP method), to produce components of very large size and of very small pitch because of the lack of constraints on flatness and alignment, to reduce the manufacturing costs in a radical way, to create all kinds of diodes in relation to the choice of material for the connection contacts.

In particular, the connection contacts can be made of a doped metal, the doping agent diffusing into the second component.

This doping agent can be, for example, indium and/or arsenic and/or antimony and/or mercury.

It is possible to produce the electrically active zone and to carry out the assembly step simultaneously.

According to one example, the first and second components can be respectively, a reading circuit and an infra-red detection circuit, for example made of CdHgTe.

Another subject of the invention is a hybrid device comprising first and second assembled components, the first component being fitted with at least one connection contact, an electrical conductor, comprising at least one material capable of diffusing into the second component, and the second component having at least one zone doped with said material, each doped area being arranged facing and in contact with a corresponding connection contact.

The material capable of diffusing can be a material constituting a doping agent in the second component.

BRIEF DESCRIPTION OF THE FIGURES

In any event, the characteristics and advantages of the invention will better become apparent in the light of the description which will follow. This description is supported by embodiment examples given for explanatory purposes which are non-limitative and which make reference to the appended drawings in which.

DETAILED DESCRIPTION OF EMBODIMENTS OF THE INVENTION

Figure 1:
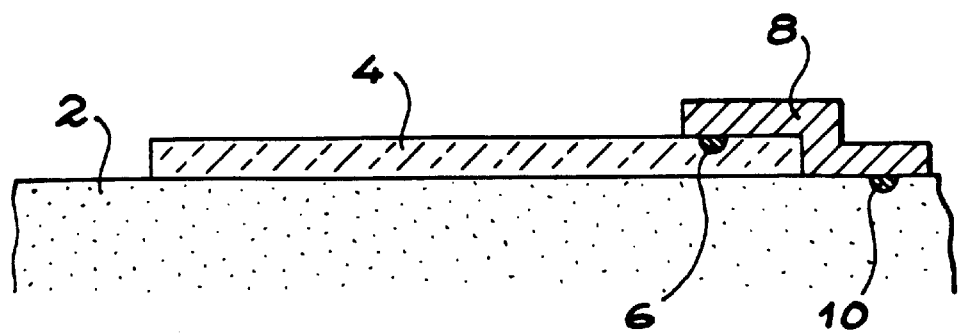
FIG. 1 shows an ELO device, the active face of which is situated on the other side from the active face of a reading circuit, the epitaxiated layer and the reading circuit being connected by post-assembly operation technology.
Figure 2:
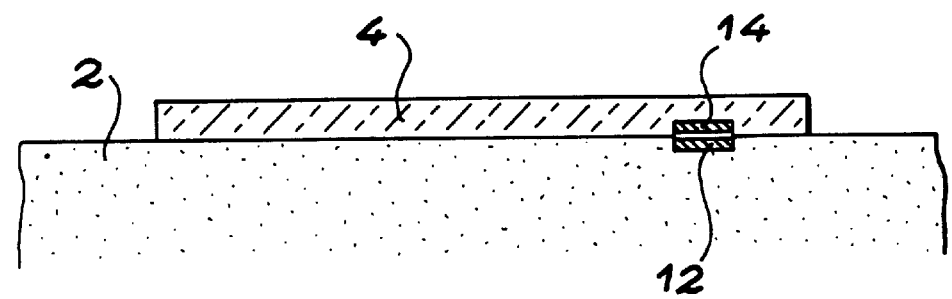
FIG. 2 shows an ELO device, the active face of which is situated facing the reading circuit, the technologies carried out on the layer and the reading circuit being assembled facing one another.
Figure 3:
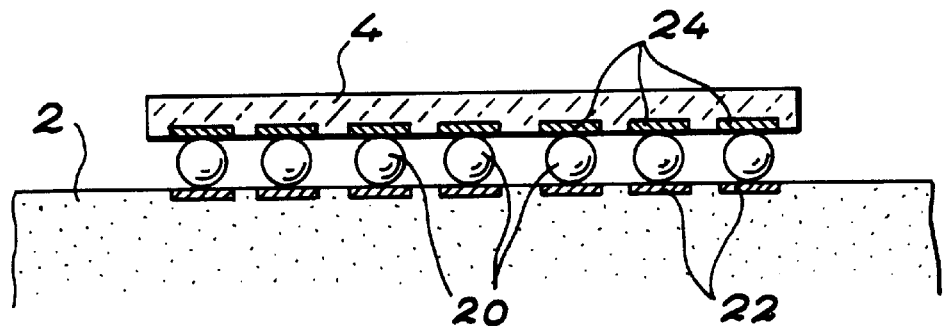
FIG. 3 shows a FLIP-CHIP device, an epitaxiated layer and a reading circuit being connected using beads of solder.
Figure 4:
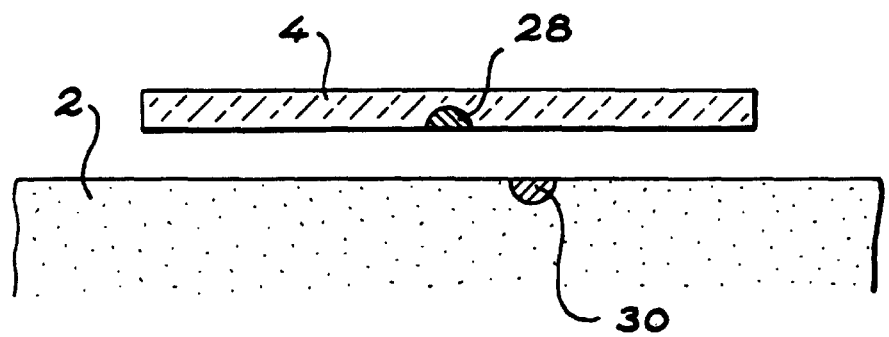
FIG. 4 shows the mis-alignments dx, dy introduced by the assembly of two assembled components.
Figure 5:
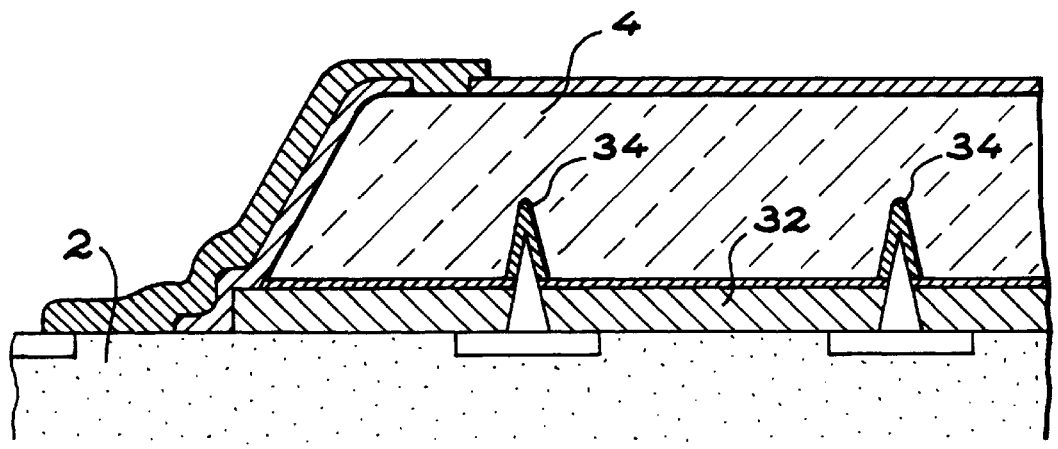
FIG. 5 shows an SAB device
Figure 6:
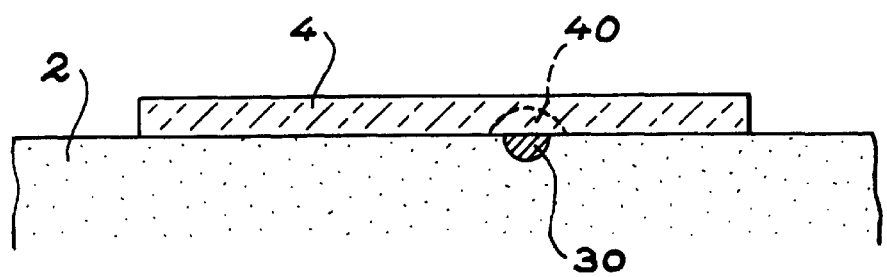
FIG. 6 shows a device according to the invention.

FIG. 6 shows an assembly produced according to the invention, from a silicon substrate comprising a reading circuit and a thin epitaxial layer 4.

In the text that follows, the substrate comprising the reading circuit is simply designated as "reading circuit 2").

By an epitaxial layer, one understands a layer which has been initially formed by epitaxy on another substrate and which has been joined onto circuit 2. An active zone 40 is created in layer 4 during the assembly operation, by induced diffusion from the material of a metal contact 30 of the reading circuit 2.

The zone 40 of the joined thin layer has been created during the operation of assembling the thin layer and the reading circuit. This zone is electrically active: in the case of a radiation detector, the zone can be a diode (photo-voltaic detector) or a contact (photo-conductor detector).

Numerous zones of the zone 40 type can be present on an assembled circuit, all generated during the assembly operation.

Figure 7:
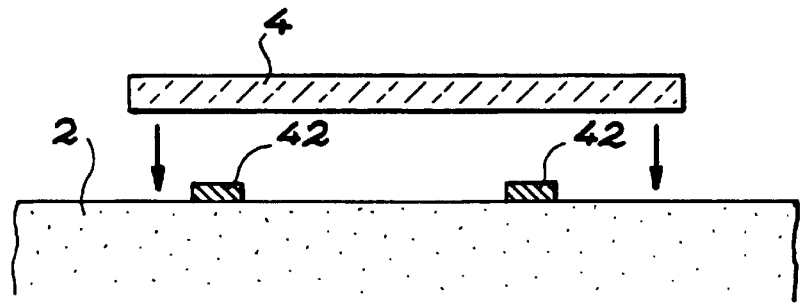
FIGS. 7A to 7C shows steps of a method according to the invention.
FIG. 7D illustrates a variant of the implementation of the invention.
Figure 7:
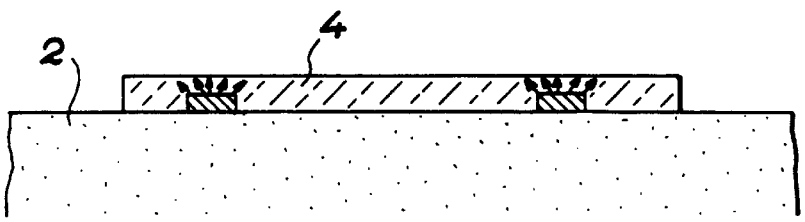
Figure 7:
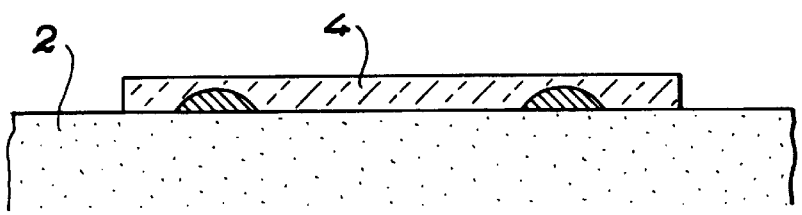
Figure 7:
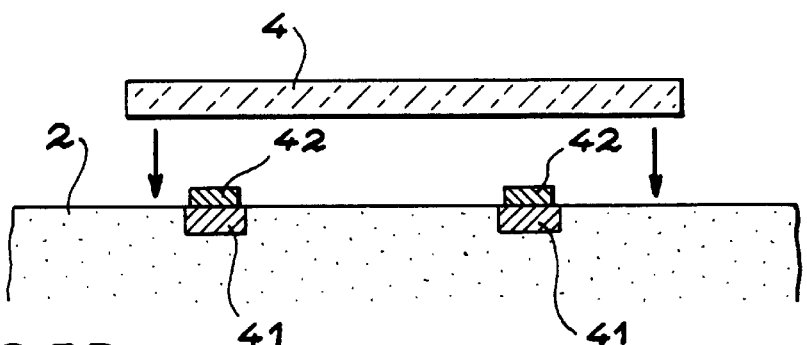

FIGS. 7A to 7C show the general principle of producing a device according to the invention.

FIGS. 7A to 7C show the transfer of a thin layer 4 (called the epitaxial layer) onto the surface of a substrate 2 comprising the reading circuit. The surface of the substrate has been previously polished to permit good adhesion of the thin layer. It should be observed that the conductive contacts 42 including at least one doping material capable of diffusing into the thin layer, are also formed at the surface of the reading circuit.

During the assembly operation, the epitaxial layer adheres to the surface of the reading circuit, through Van der Waals forces. After deposition of the layer, annealing enables the doping agent to diffuse into the epitaxial layer and to create (for example) a diode facing each connection contact. The diode created is self-aligned with the zone of the reading circuit facing it.

FIG. 7D corresponds to an improved variant of the method. In order to avoid diffusion of the doping agent to the interior of the reading circuit, a diffusion barrier layer 41 (for example made of platinum) is inserted between the connection contacts and the reading circuit.

A method of producing an infra-red detector of large size (2000×2000 points, with a pitch of 20 $\mu$m) can therefore be as follows:

an epitaxial layer 4, of large size, is created on a substrate (CdTe, for example), a reading circuit 2 fitted with indium contact points 42 with the desired pitch (here: 20 $\mu$m) is produced, under vacuum, the epitaxial layer is deposited on the reading circuit (without any specific alignment precautions: FIG. 7A), the indium contact points 42 are made to diffuse into the epitaxial layer 4, (FIG. 7B), in a manner to provide a diode (FIG. 7C).

The indium contacts 42 are preferably produced with a very small thickness (210 nm) so as not to interfere with the adhesion by Van der Waals forces. In addition, thanks to their small thickness, the contacts constitute diffusion sources of limited volume.

An embodiment of an infra-red detector conforming to the invention, will now be described.

First of all, the reading circuit can be produced using the usual assembly methods (for example CMOS). A particular finishing process enables one to produce:

polishing of the assembly to an optical finish, diffusion contacts for doping the epitaxiated layer.

One method of producing this circuit can be as follows:

deposition of a layer of platinum and photo-etching (on the places for the photo-detection pixels): this layer is used as a barrier, on the reading circuit side, to the doping agent to be deposited later. The platinum contacts are situated above the contact pick-ups made in the reading circuit, deposition of a thick layer of oxide (to make it flat), a flattening polish until the platinum is lightly touched upon (Chemical Mechanical Polishing (CMP), traditionally used in the semi-conductor industry), deposition by lift-off of a layer of indium, a few Angstroms thick, for example 100 Å on a square of 2×2 μm, above the platinized areas.

With regard to the creation of the infra-red detection circuit by epitaxy, one may, for example, produce large size layers by two techniques (liquid phase epitaxy or epitaxy by molecular jet) on different types of substrate (CdZnTe, silicon, . . . ). On this subject, reference may be made for example, to U.S. Pat. No. 4,056,304.

Figure 8:
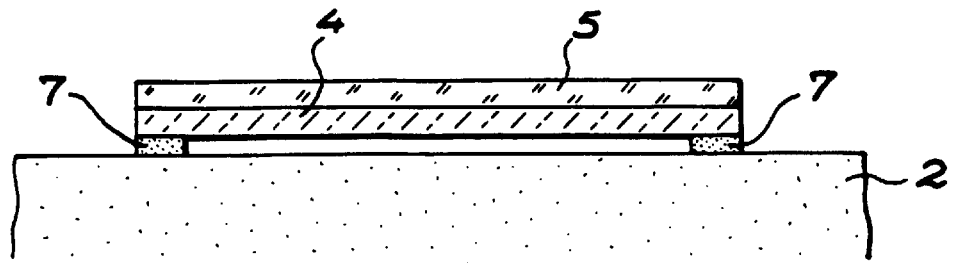
FIGS. 8A and 8B shows assembly steps in the context of a method according to the invention.
Figure 8:
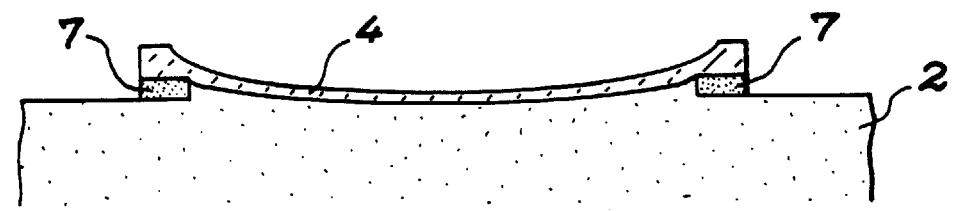

With regard to the assembly operation, one may, for example proceed in a way analogous to the FLIP-CHIP technique by sticking, using a resin 7, the periphery of layer 4 onto substrate 5 under vacuum (face against the reading silicon, FIG. 8A), and by chemically attacking the support substrate 5 (FIG. 8B).

One may also perhaps passivate the CdHgTe surface that has been laid bare.

One may also cause the indium in contact with the CdHgTe to diffuse (possibly under a Hg atmosphere).

Indium is a type N doping agent for CdHgTe: a time of from a few minutes to a few hours at low temperatures (120° to 300° C.) allows one to obtain an N type junction on CdHgTe of a few μm depth facing each indium contact 42 deposited on the silicon. This junction will be connected to the reading silicon through platinum contacts 41.

If one wishes directly to pick up the type P substrate contact, the deposition of two types of doping agent will be carried out on the reading circuit, a type N and a type P (arsenic, antimony).

Figure 9:
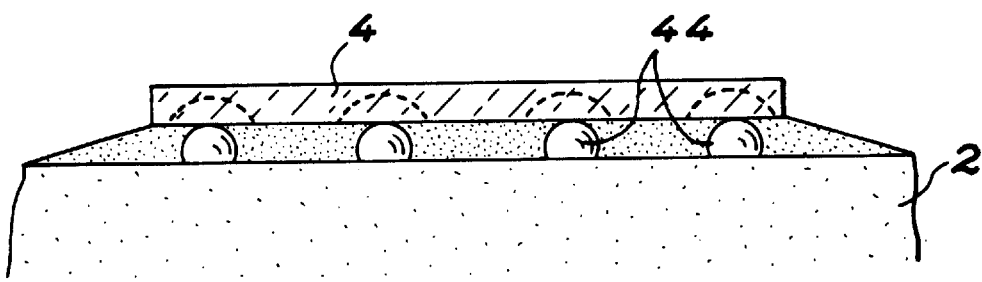
FIG. 9 illustrates a variant of a method according to the invention.

An interesting variant of the invention is a combination of FLIP-CHIP techniques and the technique above. This variant is described by the device shown in FIG. 9.

In the case of an infra-red detector, it is produced as follows:

hybridization of the CMT layer 4, still connected to its substrate, onto the reading circuit 2 (indium welds itself onto the CdHgTe), a coating operation, for example using the ERAM technique described in document FR 2 715 002. Reference number 46 designates a coating resin, diffusion of the indium from the beads 44 into the epitaxial layer, thereby forming an N on P zone, a thinning operation for example such as that also described in document FR 2 715 002.

This technique is interesting since it uses technologies well proven elsewhere, and it allows the layer to be handled on its substrate.

The invention can also be applied to the production of:

retinae for light emitting diodes, retinae for photo-conductive or photo-voltaic detectors of very large sizes for detection in all spectral ranges or for diode matrices, low cost detection retinae of all sizes.

The invention is also applicable to all the other applications, where diffusion from a diode or from an ohmic contact through a solid localized source allows the creation of an active component during the face to face assembly of two components.

What is claimed is:

1. Method of assembling first and second electronic components (2, 4), the first of the components being fitted with conductive connection contacts (42, 44), comprising at least one material capable of diffusing into the second component, the method comprising;

a step of assembling the two components, and the creation of at least one electrically active zone (40) in the second component, by diffusion of said material of the connection contacts (42) from the first component into the second component.

2. Method according to claim 1, in which the electrically active zone is created simultaneously with the assembly step.

3. Method of assembly according to claim 1, in which the assembly step is carried out by hybridization of the second component onto the first using metal beads (44), said beads forming the conductive contacts.

4. Method according to claim 3, in which the creation of the electrically active zone is followed by a step of coating the second component with a resin.

5. Method according to claims 1, in which the first component (2) comprises a reading circuit.

6. Method according to claim 1, in which the second component comprises a detection circuit.

7. Method according to claim 6, in which the detection circuit is a circuit made of CdHgTe.

8. Method according to one of the preceding claims, in which the material (42) of the connection contacts includes a doping agent material for the second component.

9. Method according to claim 8, in which the material (42) of the connection contacts includes indium and/or arsenic and/or antimony and/or mercury.

10. Method according to one of claims 1 to 5, in which the second component is a layer formed by epitaxy on a CdTe-substrate.

11. Method of assembly according to claim 2, in which the assembly step is carried out by hybridization of the second component onto the first using metal beads (44), said beads forming the conductive contacts.

12. Method of assembly according to claim 11, in which the creation of the electrically active zone is followed by a step of coating the second component with a resin.

13. Method according to claim 2, in which the first component (2) comprises a reading circuit.

14. Method according to claim 3, in which the first component (2) comprises a reading circuit.

15. Method according to claim 4, in which the first component (2) comprises a reading circuit.

16. Method according to claim 2, in which the second component comprises a detection circuit.

17. Method according to claim 3, in which the second component comprises a detection circuit.

18. Method according to claim 4, in which the second component comprises a detection circuit.

19. Method according to claim 5, in which the second component comprises a detection circuit.

20. Method according to claim 16, in which the detection circuit is a circuit made of CdHgTe.

* * * * *